United States Patent
Seo

(10) Patent No.: US 10,250,129 B2
(45) Date of Patent: Apr. 2, 2019

(54) CHARGE PUMP CIRCUIT AND INTERNAL VOLTAGE GENERATION CIRCUIT INCLUDING THE SAME

(71) Applicant: SK hynix Inc., Gyeonggi-do (KR)

(72) Inventor: Sang-Jo Seo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 217 days.

(21) Appl. No.: 15/207,283

(22) Filed: Jul. 11, 2016

(65) Prior Publication Data

US 2017/0264191 A1  Sep. 14, 2017

(30) Foreign Application Priority Data

Mar. 8, 2016 (KR) .................. 10-2016-0027621

(51) Int. Cl.
*H02M 3/07* (2006.01)
*G11C 5/14* (2006.01)

(52) U.S. Cl.
CPC ............... *H02M 3/07* (2013.01); *G11C 5/145* (2013.01); *G11C 5/147* (2013.01)

(58) Field of Classification Search
CPC ............................. H02M 3/07; H01L 27/0222
See application file for complete search history.

(56) References Cited

U.S. PATENT DOCUMENTS 8,300,489 B2 * 10/2012 Fifield .................. G11C 5/145
327/536

FOREIGN PATENT DOCUMENTS

KR   1020020071511   9/2002
KR   1020030061351   7/2003

* cited by examiner

*Primary Examiner* — Hai L Nguyen
(74) *Attorney, Agent, or Firm* — IP & T Group LLP

(57) ABSTRACT

A charge pump circuit may include a charge pump unit suitable for performing a charge pump operation until an output voltage reaches a target voltage; and a multi-stage charge sharing unit comprising first to Nth capacitors coupled in parallel between the charge pump unit and a load circuit, the multi-stage charge sharing unit being suitable for sequentially performing first to Nth charge sharing operations between the first to Nth capacitors, respectively, and the load circuit after the charge sharing operation, wherein the first to Nth charge sharing operations are mutually and exclusively performed, and N is a natural number equal to or greater than 2.

10 Claims, 8 Drawing Sheets

FIG. 6

|  | SW_GRP1 ||||| SW_GRP2 ||||
| --- | --- | --- | --- | --- | --- | --- | --- | --- | --- |
|  | SWA_1 | SWA_2 | SWA_3 | SWA_4 | ... | SWA_N | SWB_1 | SWB_2 | ... | SWB_N-1 |
| charge pumping | OFF | ON | ON | ON |  | ON | ON | ON |  | ON |
| 1st sharing | ON | OFF | ON | ON |  | ON | ON | ON |  | ON |
| 2nd sharing | ON | ON | OFF | ON |  | ON | OFF | ON |  | ON |
| 3rd sharing | ON | ON | ON | OFF |  | ON | OFF | OFF |  | ON |
| ⋮ |  |  |  |  | ⋮ |  |  |  |  | ⋮ |
| N-1th sharing | ON | ON | ON | ON |  | OFF | OFF | OFF |  | ON |
| Nth sharing | ON | ON | ON | ON |  | ON | OFF | OFF |  | OFF |

| | 1 | | 2 | | 3 | | ... | N-1 | | N | |
|---|---|---|---|---|---|---|---|---|---|---|---|
| | SWA | SWB | SWA | SWB | SWA | SWB | | SWA | SWB | SWA | SWB |
| Charging | ON | OFF | ON | OFF | ON | OFF | | ON | OFF | ON | OFF |
| 1st sharing | OFF | ON | ON | OFF | ON | OFF | | ON | OFF | ON | OFF |
| 2nd sharing | OFF | OFF | OFF | ON | ON | OFF | ... | ON | OFF | ON | OFF |
| 3rd sharing | OFF | OFF | OFF | OFF | OFF | ON | | ON | OFF | ON | OFF |
| - | | | | | | | | | | | |
| N-1th sharing | OFF | OFF | OFF | OFF | OFF | OFF | | OFF | ON | ON | OFF |
| Nth sharing | OFF | OFF | OFF | OFF | OFF | OFF | | OFF | OFF | ON | ON |

…

CHARGE PUMP CIRCUIT AND INTERNAL VOLTAGE GENERATION CIRCUIT INCLUDING THE SAME

CROSS-REFERENCE TO RELATED APPLICATIONS

The present application claims priority under 35 U.S.C. § 119(a) to Korean Patent Application No. 10-2016-0027621, filed on Mar. 8, 2016, which is incorporated herein by reference in its entirety.

BACKGROUND

1. Field

Exemplary embodiments of the present invention relate generally to a semiconductor design technology and, more particularly, to a charge pump circuit of a semiconductor memory device and an internal voltage generation circuit including the same.

2. Description of the Related Art

Semiconductor memory devices generate internal voltages having various levels using an external voltage, and the internal voltages are used for various internal operations of the semiconductor memory devices.

Existing methods for generating internal voltages using an external voltage are largely divided into two categories. According to a first category method, an internal voltage lower than an external voltage may be generated by down-converting the external voltage to a lower potential. According to a second category method, an internal voltage may be generated that is higher than an external voltage or lower than a ground voltage by charge-pumping the external voltage.

A high voltage VPP and a back bias voltage VBB are widely used as internal voltages generated through charge-pumping. The high voltage VPP is generated in order for the gate of a cell transistor (or word line) to have a higher potential than a power supply voltage VCC as an external voltage, thereby preventing a loss of cell data and accessing a memory cell. The back bias voltage VBB is generated in order for the bulk of a cell transistor to have a lower potential than a ground voltage VSS as an external voltage, thereby preventing a loss of cell data.

FIG. 1 is a diagram illustrating a conventional charge pump circuit 10.

Referring to FIG. 1, the charge pump circuit 10 includes a charge pump unit 12, an output capacitor C0 and a switch SW.

The charge pump unit 12 pumps an input voltage to an output voltage VPASSPMP which is boosted to a level required by a load circuit 20. The charge pump unit 12 may include a plurality of switches (not illustrated) which are turned on/off based on first and second clocks CLK1 and CLK2 which are complementary in phase. The charge pump unit 12 may charge an output capacitor C0 with charge of a specific node of the switches or discharge the output capacitor C0, and thus acquire the boosted output voltage VPASSPMP at an output terminal OUT_ND.

That is, the charge pump circuit 10 generates the output voltage VPASSPMP at a high voltage level by boosting the input voltage, and uses the output capacitor C0 to retain the boosted output voltage VPASSPMP at a predetermined level. The load circuit 20 coupled to the output terminal OUT_ND of the charge pump circuit 10 may receive a voltage and current from the charge pump circuit 10.

The operation of the above-described charge pump circuit 10 will be described as follows. At the beginning, the charge pump circuit 10 opens the switch SW, and performs a charge pump operation to charge the output capacitor C0 with the boosted output voltage VPASSPMP. Then, when the output voltage VPASSPMP reaches a target voltage, the charge pump circuit 10 may close the switch SW. The output voltage VPASSPMP of the charge pump circuit 10 is supplied to an input terminal INIT_ND of the load circuit 20.

At this time, when the output voltage VPASSPMP of the charge pump circuit 10 is supplied to the input terminal INIT_ND of the load circuit 20, a charge sharing operation is performed. At the moment that the output terminal OUT_ND of the charge pump circuit 10 and the input terminal INIT_ND of the load circuit 20 have the same capacitance during the charge sharing operation, the charge pump circuit 10 may provide a voltage having the intermediate level of the output voltage VPASSPMP to the load circuit 20.

In the charge pump circuit 10, the capacitance (or size) of the output capacitor C0 may be determined in consideration of the voltage/current supply ability of the charge pump circuit 10, and current amount and voltage stability (ripple) required by the load circuit 20.

That is, when the output capacitor C0 has a high capacitance, a voltage ripple caused by the pumping operation may be reduced, and the voltage retention ability of charge pump circuit 10 may be improved even though the load circuit 20 momentarily uses current. However, for retaining the capacitance, the output capacitor C0 requires a large amount of charge at the initial stage. Furthermore, since the charge pump circuit 10 considers the output capacitor C0 as a load, the charge pump circuit 10 requires a larger amount of time to recover the voltage of the output terminal OUT_ND when the voltage of the output terminal OUT_ND is lowered. On the other hand, when the output capacitor C0 has a small capacitance, the voltage of the output terminal OUT_ND may be recovered within a short time, even though the voltage of the output terminal OUT_ND is lowered. However, a voltage ripple caused by the pumping operation may be increased, and a voltage variation may occur due to momentary current consumption.

Therefore, there have been difficulties in determining the capacitance of the output capacitor C0 of the charge pump circuit 10.

SUMMARY

Various embodiments are directed to an improved charge pump circuit exhibiting improved transmission efficiency of an output voltage by performing a plurality of charge sharing operations, and an internal voltage generation circuit including the same In an embodiment, a charge pump circuit may include: a charge pump unit suitable for performing a charge pump operation until an output voltage reaches a target voltage; and a multi-stage charge sharing unit comprising first to Nth capacitors coupled in parallel between the charge pump unit and a load circuit, the multi-stage charge sharing unit being suitable for sequentially performing first to Nth charge sharing operations between the first to Nth capacitors, respectively, and the load circuit after the charge sharing operation, wherein the first to Nth charge sharing operations are mutually and exclusively performed, and N is a natural number equal to or greater than 2.

In an embodiment, an internal voltage generation circuit may include: a detection unit suitable for generating a detection signal by comparing a reference voltage and an internal voltage; an oscillator suitable for generating a periodic signal in response to the detection signal; and a charge pump circuit including first to Nth capacitors coupled in parallel between an output terminal of the internal voltage and an internal circuit, and suitable for performing a charge pump operation in response to the periodic signal until the internal voltage reaches a target voltage, and sequentially performing first to Nth charge sharing operations between the first to Nth capacitors, respectively, and the internal circuit, after the charge pump operation, wherein the first to Nth charge sharing operations are mutually and exclusively performed to provide the internal voltage to the internal circuit, and the N is a natural number equal to or greater than 2.

In an embodiment, there is provided a charge pump method of a charge pump circuit which includes first to Nth capacitors coupled in parallel between an output terminal and a load circuit. The charge pump method may include: performing a charge pump operation until an output voltage reaches a target voltage; and sequentially performing first to Nth charge sharing operations between the first to Nth capacitors, respectively, and the load circuit, after the charge pump operation, wherein the first to Nth charge sharing operations are mutually and exclusively performed, and the N is a natural number equal to or greater than 2.

In an embodiment, a method of generating an internal voltage may include: performing a charge pump operation in response to a periodic signal until the internal voltage reaches a target voltage; and sequentially performing first to Nth charge sharing operations between first to Nth capacitors, respectively, and an internal circuit, after the charge pump operation, wherein the first to Nth capacitors are coupled in parallel between an output terminal of the internal voltage and the internal circuit, wherein the first to Nth charge sharing operations are mutually and exclusively performed, and the N is a natural number equal to or greater than 2. The method may further comprise: generating a detection signal by comparing a refresh voltage and the internal voltage; and generating the periodic signal in response to the detection signal.

BRIEF DESCRIPTION OF THE DRAWINGS

These and other features and advantages of the present invention will become apparent from the following described embodiments of the present invention in reference to the accompanying drawings in which:

FIG. 6 is a table for describing an operation of the charge pump circuit of FIG. 5.

DETAILED DESCRIPTION

Figure 1:
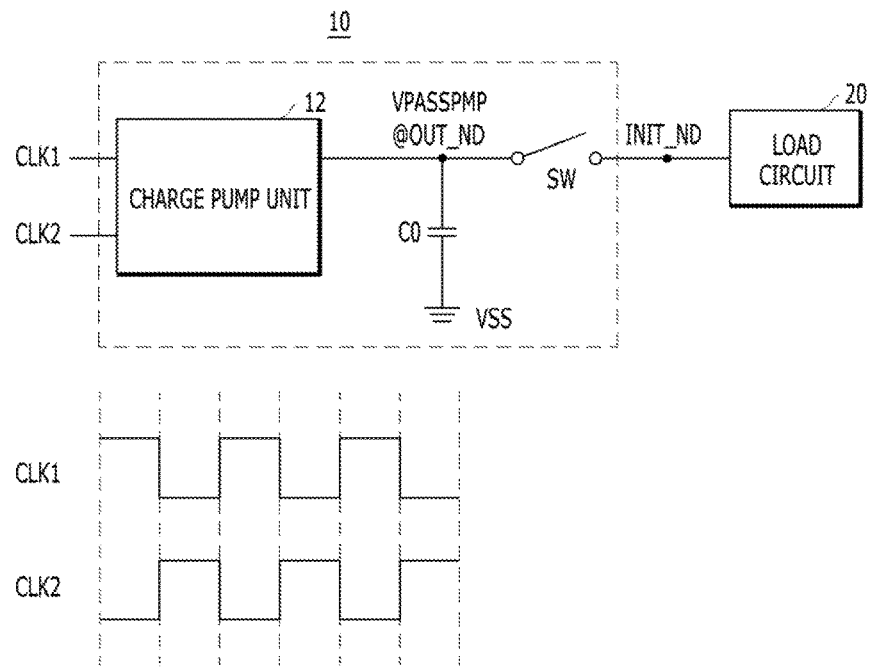
FIG. 1 is a diagram illustrating a conventional charge pump circuit.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "includes," "comprising," and "including" when used in this specification, indicate the presence of stated features, but do not preclude the presence or addition of one or more other features. As used herein, the term "and/or" Indicates any and all combinations of one or more of the associated listed items.

It will be understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

It is also noted, that in some instances, as would be apparent to those skilled in the relevant art, a feature or element described in connection with one embodiment may be used singly or in combination with other features or elements of another embodiment, unless otherwise specifically indicated.

Figure 2:
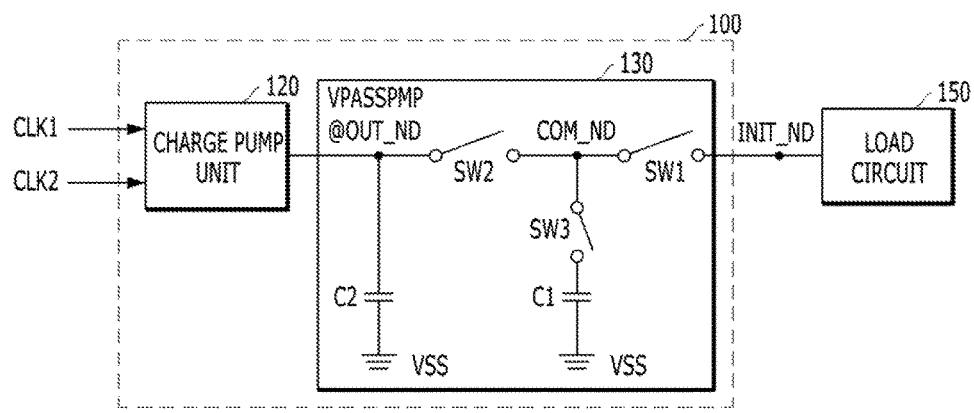
FIG. 2 is a circuit diagram of a charge pump circuit, according to an embodiment of the present invention.

FIG. 2 is a circuit diagram of a charge pump circuit 100 according to an embodiment of the present invention.

Referring to FIG. 2, the charge pump circuit 100 may include a charge pump unit 120 and a multi-stage charge sharing unit 130.

The charge pump unit 120 may perform a charge pump operation until an output voltage VPASSPMP reaches a target voltage. The charge pump unit 120 may include a plurality of switches (not illustrated) which are turned on/off based on first and second clocks CLK1 and CLK2 which are complementary in phase. The charge pump unit 120 may charge first and second capacitors C1 and C2 of the multi-stage charge sharing unit 130 with charge of a specific node of the switches or discharge the first and second capacitors C1 and C2, and thus provide the boosted output voltage VPASSPMP at an output terminal OUT_ND thereof.

The multi-stage charge sharing unit 130 may include the first and second capacitors C1 and C2 coupled in parallel between the charge pump unit 120 and a load circuit 150. After the charge pump operation of the charge pump unit 120, the multi-stage charge sharing unit 130 may sequentially perform first and second charge sharing operations between the first and second capacitors C1 and C2 and the load circuit 150. At this time, the first and second charge sharing operations may be mutually exclusively performed.

More specifically, the multi-stage charge sharing unit 130 may include first to third switches SW1 to SW3 and the first and second capacitors C1 and C2. The first and second switches SW1 and SW2 may be coupled in series between the output terminal OUT_ND of the charge pump unit 120 and the input terminal INIT_ND of the load circuit 150, and the third switch SW3 may have one terminal coupled to a common node COM_ND of the first and second switches SW1 and SW2. The first capacitor C1 may be coupled between the other terminal of the third switch SW3 and a ground voltage terminal VSS. The second capacitor C2 may be coupled between the output terminal OUT_ND of the charge pump unit 120 and the ground voltage terminal VSS. At this time, the first and second switches SW1 and SW2 may be sequentially turned off during a charge pump operation and a first charge sharing operation. The third switch SW3 may be turned off during a second charge sharing operation after the first charge sharing operation.

In the present embodiment, the total capacitance of the first and second capacitors C1 and C2 may be equal to the capacitance of the output capacitor C0 of FIG. 1.

In the charge pump circuit 100 having the above-described configuration, two or more capacitors may be coupled in parallel to each other at the output terminal OUT_ND. The total capacitance of the capacitors may be equal to a target capacitance for a target voltage. The charge pump circuit 100 may charge the capacitors with the output voltage VPASSPMP by performing the charge pump operation until the output voltage VPASSPMP reaches the target voltage, and then sequentially perform the charge sharing operations between the capacitors and the load circuit 150. At this time, two or more charge sharing operations may be mutually exclusively performed. That is, the charge pump circuit 100 may first perform a charge sharing operation to increase the voltage of the input terminal INIT_ND of the load circuit 150. In this state, the charge pump circuit 100 may perform a charge sharing operation again. Thus, the input terminal INIT_ND of the load circuit 150 may rapidly reach the target voltage.

Furthermore, as the charge sharing operations are sequentially performed, a voltage drop at the output terminal OUT_ND of the charge pump circuit 100 may be reduced. Thus, the protection characteristic for break-down voltage may be improved. Furthermore, since the output capacitance of the charge pump circuit 100 is lowered after the charge pump circuit 100 is coupled to the load circuit 150, the input terminal INIT_ND of the load circuit 150 may rapidly reach the target voltage of the load circuit 150 thus improving the operating speed of the load circuit 150.

Hereafter, an operation of the charge pump circuit 100 of FIG. 2 will be described with reference to FIGS. 3A to 4.

Figure 3A:
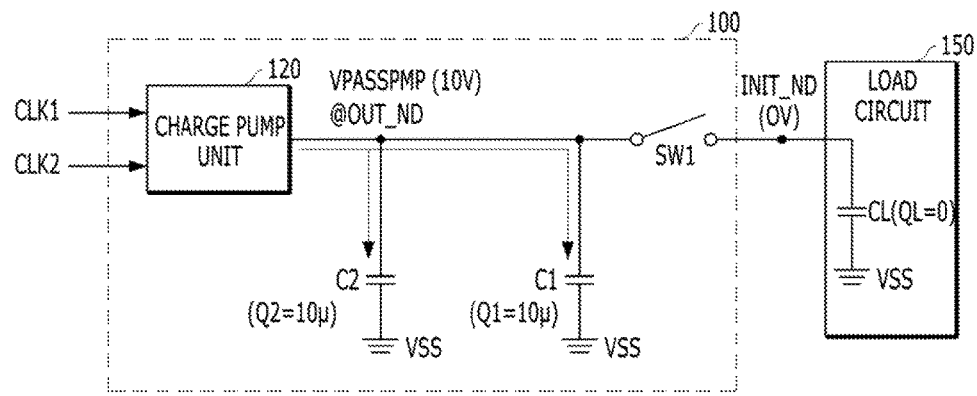
FIGS. 3A to 3C are circuit diagrams for describing an operation of the charge pump circuit of FIG. 2.
Figure 3B:
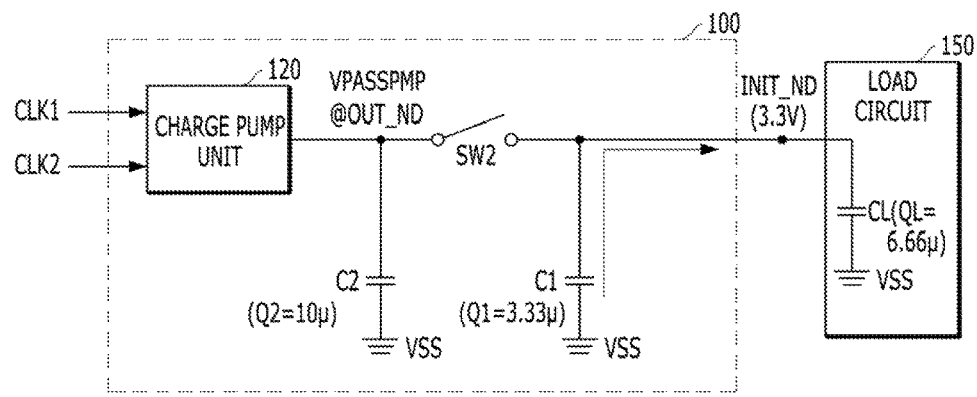
Figure 3C:
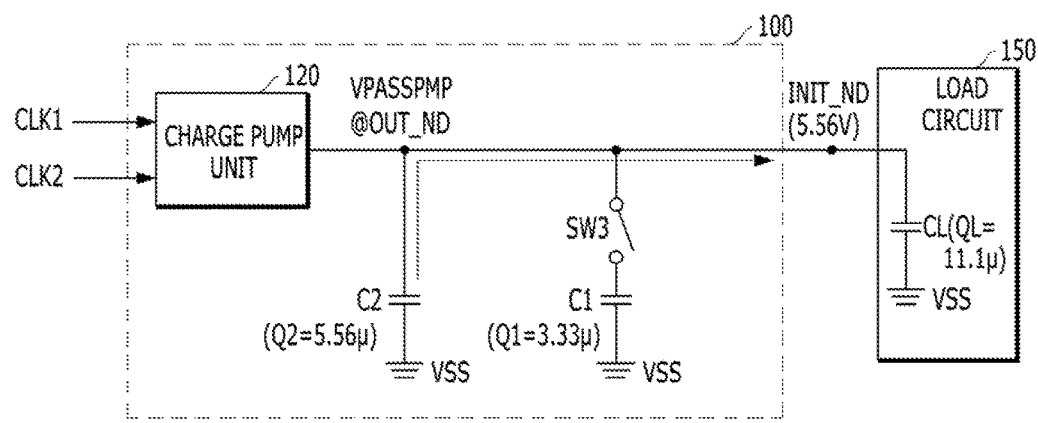

FIGS. 3A to 3C are circuit diagrams for describing the operation of the charge pump circuit 100 of FIG. 2. FIG. 4 is a timing diagram for describing the operation of the charge pump circuit 100 of FIG. 2. As an example, let us suppose that the first capacitor C1 has the same capacitance as the second capacitor C2 (for example, 1 uF), and the total capacitance (2 uF) of the first and second capacitors C1 and C2 is equal to the capacitance (2 uF) of a load capacitor CL of the load circuit 150.

Figure 4:
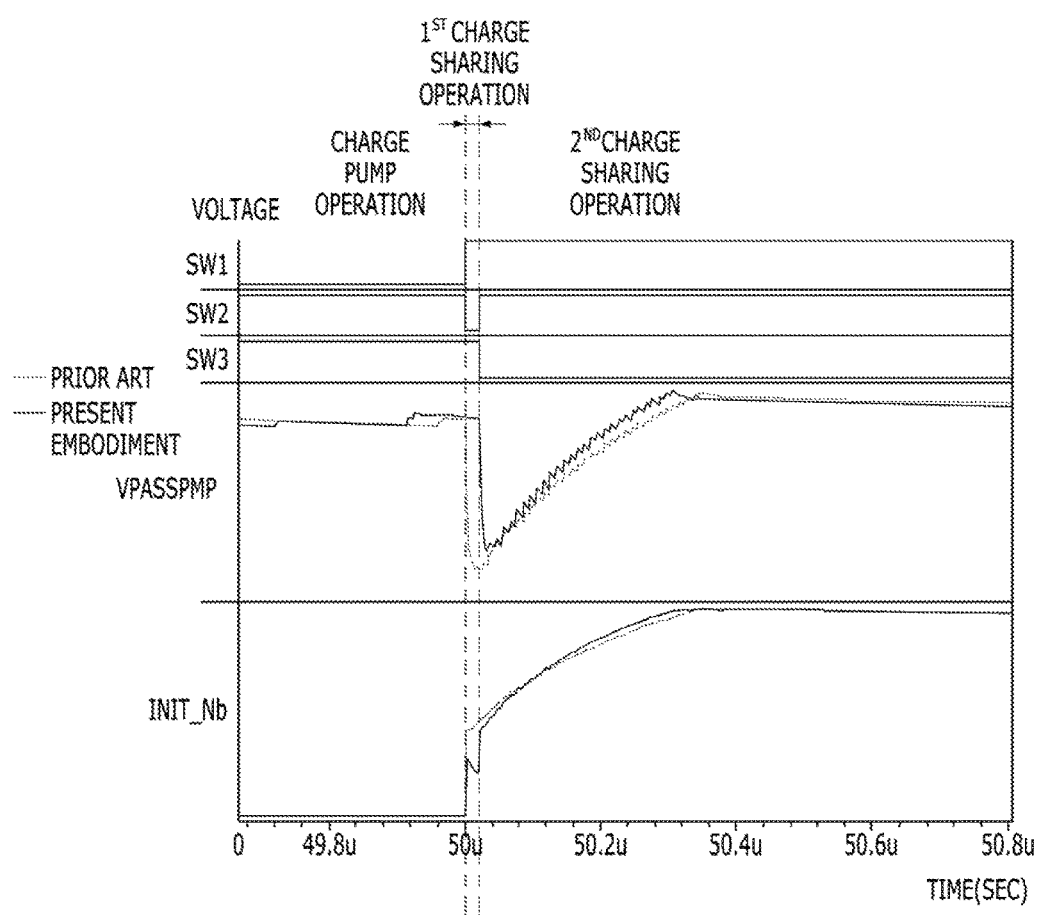
FIG. 4 is a timing diagram for describing an operation of the charge pump circuit of FIG. 2.

Referring to FIGS. 3A and 4, the charge pump operation may be performed at the beginning. During the charge pump operation, the first switch SW1 may be turned off, and the second and third switches SW2 and SW3 may be turned on. Thus, the charge pump circuit 100 may charge the first and second capacitors C1 and C2 with the boosted output voltage VPASSPMP. At this time, when the output voltage VPASSPMP is 10V, a charge of 10 u may be stored in the first and second capacitors C1 and C2 because the first and second capacitors C1 and C2 have the same capacitance. That is, charges Q1 and Q2 of the first and second capacitors C1 and C2 each are 10 u (Q1=Q2=10 u), and a charge QL of the load capacitor CL is 0 u (QL=0 u).

Furthermore, when the total capacitance of the first and second capacitors C1 and C2 in an embodiment is equal to the capacitance of the output capacitor C0 of FIG. 1, the output voltage VPASSPMP of the output terminal OUT_ND of the conventional charge pump circuit 10 may have substantially the same value as the output voltage VPASSPMP of the output terminal OUT_ND of the charge pump circuit 100.

Referring to FIG. 3B and FIG. 4, the first charge sharing operation may be performed. During the first charge sharing operation, the second switch SW2 may be turned off, and the first and third switches SW1 and SW3 may be turned on. Thus, the output voltage VPASSPMP stored in the first capacitor C1 may be transmitted to the load circuit 150. At this time, since the ratio of the capacitance of the first capacitor C1 to the capacitance of the load capacitor CL is 1:2, charges of 3.33 u and 6.66 u may be stored in the first capacitor C1 and the load capacitor CL, respectively, according to the electric charge conservation law. That is, the charges Q1 and Q2 of the first and second capacitors C1 and C2 are 3.33 u and 10 u (Q1=3.33 u, Q2=10 u), and the charge QL of the load capacitor CL is 6.66 u (QL=6.66 u). As a result, a voltage of 3.3V may be transmitted to the input terminal INIT_ND of the load circuit 150.

Referring to FIG. 3C and FIG. 4, the second charge sharing operation may be performed. During the second charge sharing operation, the third switch SW3 may be turned off, and the first and second switches SW1 and SW2 may be turned on. Thus, the output voltage VPASSPMP stored in the second capacitor C2 may be transmitted to the load circuit 150. At this time, since the ratio of the capacitance of the second capacitor C2 to the capacitance of the load capacitor CL is 1:2, charges of 5.56 u and 11.1 u may be stored in the second capacitor C2 and the load capacitor CL, respectively, according to the electric charge conservation law. That is, the charges Q1 and Q2 of the first and second capacitors C1 and C2 are 3.33 u and 5.56 u (Q1=3.33 u, Q2=5.56 u), and the charge QL of the load capacitor CL is 11.1 u (QL=11.1 u). As a result, a voltage of 5.56V may be transmitted to the input terminal INIT_ND of the load circuit 150. That is, under the same condition, the transmission efficiency of the output voltage VPASSPMP transmitted from the conventional charge pump circuit 10 to the load circuit 20 is 50%, however, the transmission efficiency of the output voltage VPASSPMP transmitted from the charge pump circuit 100 to the load circuit 150 in accordance with the present embodiment may be improved to 55.6%.

In the present embodiment, a two-stage charge sharing operation has been described. However, the present embodiment is not limited thereto. For example, generally, a charge pump circuit may improve its voltage transmission efficiency by performing an N-stage charge sharing operation wherein N is a natural number equal to or greater than two (2). Hereafter, a charge pump circuit capable of performing an N-stage charge sharing operation through N capacitors will be described in reference to FIG. 5.

Figure 5:
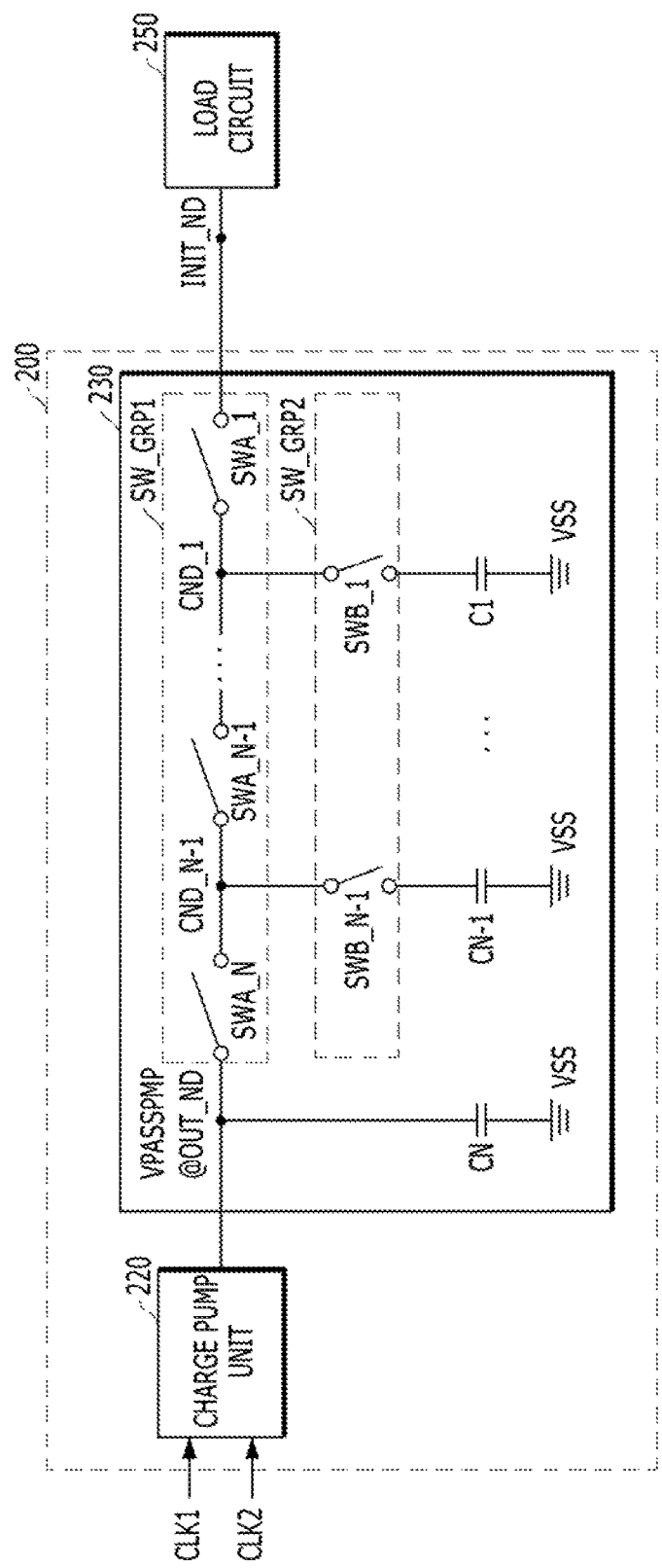
FIG. 5 is a circuit diagram of a charge pump circuit, according to another embodiment of the present invention.

FIG. 5 is a circuit diagram of a charge pump circuit 200, according to another embodiment of the present invention.

Referring to FIG. 5, the charge pump circuit 200 may include a charge pump unit 220 and a multi-stage charge sharing unit 230.

The charge pump unit 220 may perform a charge pump operation until an output voltage VPASSPMP reaches a target voltage. The charge pump unit 220 may include a plurality of switches (not illustrated) which are turned on/off based on first and second clocks CLK1 and CLK2 which are complementary in phase. The charge pump unit 220 may charge first to Nth capacitors C1 to CN of the multi-stage charge sharing unit 230 with charge of a specific node of the switches or discharge the first to Nth capacitors C1 to CN, and thus acquire a boosted output voltage VPASSPMP at an output terminal OUT_ND thereof.

The multi-stage charge sharing unit 230 may include the first to Nth capacitors C1 to CN coupled in parallel between the charge pump unit 220 and a load circuit 250. After the charge pump operation of the charge pump unit 220, the multi-stage charge sharing unit 130 may sequentially perform first to Nth charge sharing operations between the first to Nth capacitors C1 to CN and the load circuit 250. At this time, the first to Nth charge sharing operations may be mutually exclusively performed.

More specifically, the multi-stage charge sharing unit 230 may include first and second switch groups SW_GRP1 and SW_GRP2 and first to Nth capacitors C1 to CN. The first switch group SW_GRP1 may include N (first to Nth) switches SWA_1 to SWA_N coupled in series between an input terminal INIT_ND of the load circuit 250 and the output terminal OUT_ND of the charge pump unit 220. The second switch group SW_GRP2 may include N−1 (first to (N−1)th) switches SWB_1 to SWB_N−1 coupled between the first to (N−1)th capacitors C1 to CN−1 and common nodes CND_1 to CND_N−1 between the first to Nth switches SWA_1 to SWA_N of the first switch group SW_GRP1, respectively. The first to (N−1)th capacitors C1 to CN−1 may be coupled between a ground voltage terminal VSS and the first to (N−1)th switches SWB_1 to SWB_N−1 of the second switch group SW_GRP2, respectively, and the Nth capacitor CN may be coupled between the ground voltage terminal VSS and the output terminal OUT_ND of the charge pump unit 220. At this time, the N switches SWA_1 to SWA_N of the first switch group SW_GRP1 may be sequentially turned off during the charge pump operation and the first to (N−1)th charge sharing operations. The (N−1) switches SWB_1 to SWB_N−1 of the second switch group SW_GRP2 may be turned off after the corresponding charge sharing operations among the first to (N−1)th charge sharing operations.

That is, the first to Nth switches SWA_1 to SWA_N of the first switch group SW_GRP1 may be turned off during the charge pump operation and the first to (N−1)th charge sharing operations, respectively, and may maintain a turn-on state during other operations. The first to (N−1)th switches SWB_1 to SWB_N−1 of the second switch group SW_GRP2 may be turned on during the charge pump operation, and turned off right after the first to (N−1)th charge sharing operations, respectively.

In the present embodiment, the total capacitance of the first to Nth capacitors C1 to CN may be equal to the capacitance of the output capacitor C0 of FIG. 1.

FIG. 6 is a table for describing an operation of the charge pump circuit 200 of FIG. 5.

Referring to FIG. 6, the charge pump operation may be performed at the beginning. During the charge pump operation, the first switch SWA_1 of the first switch group SW_GRP1 may be turned off, and the other switches SWA_2 to SWA_N of the first switch group SW_GRP1 may be turned on. Furthermore, the (N−1) switches SWB_1 to SWB_N−1 of the second switch groups SW_GRP2 may also be turned on. Thus, the charge pump circuit 200 may charge the first to Nth capacitors C1 to CN with the boosted output voltage VPASSPMP.

Then, the first charge sharing operation may be performed indicated as a "first sharing" in the table of FIG. 6. During the first charge sharing operation, the second switch SWA_2 of the first switch group SW_GRP1 may be turned off, and the other switches SWA_1 and SWA_3 to SWA_N of the first switch group SW_GRP1 may be turned on. Furthermore, the (N−1) switches SWB_1 to SWB_N−1 of the second switch groups SW_GRP2 may be turned on. Thus, the output voltage VPASSPMP stored in the first capacitor C1 may be transmitted to the load circuit 250.

Then, the second charge sharing operation (indicated as $2^{nd}$ sharing) may be performed. During the second charge sharing operation, the third switch SWA_3 of the first switch group SW_GRP1 may be turned off, and the other switches SWA_1, SWA2 and SWA_4 to SWA_N of the first switch group SW_GRP1 may be turned on. Furthermore, the first switch SWB_1 of the second switch group SW_GRP2 may be turned off, and the other switches SWA_2 to SWA_N−1 of the second switch group SW_GRP2 may be turned on. Thus, the output voltage VPASSPMP stored in the second capacitor C2 may be transmitted to the load circuit 250.

Then, the third charge sharing operation (indicated as $3^{rd}$ sharing) may be performed. During the third charge sharing operation, the fourth switch SWA_4 of the first switch group SW_GRP1 may be turned off, and the other switches SWA_1 to SWA_3 and SWA_5 to SWA_N of the first switch group SW_GRP1 may be turned on. Furthermore, the first and second switches SWB_1 and SWB_2 of the second switch group SW_GRP2 may be turned off, and the other switches SWA_3 to SWA_N−1 of the third switch group SW_GRP2 may be turned on. Thus, the output voltage VPASSPMP stored in the third capacitor C3 may be transmitted to the load circuit 250.

In this way, the fourth to Nth charge sharing operations may also be sequentially performed. That is, the N switches SWA_1 to SWA_N of the first switch group SW_GRP1 may be sequentially turned off during the charge pump operation and the first to (N−1)th charge sharing operations, and the (N−1) switches SWB_1 to SWB_N−1 of the second switch group SW_GRP2 may be turned off after the corresponding charge sharing operations during the first to (N−1)th charge sharing operations.

After the first to Nth charge sharing operations are sequentially performed, the transmission efficiency of the output voltage VPASSPMP transmitted from the charge pump circuit 200 to the load circuit 250 in accordance with the present embodiment under the same condition may be improved in comparison to the transmission efficiency of the output voltage VPASSPMP transmitted from the conventional charge pump circuit 10 to the load circuit 20. For example, suppose that the total capacitance of the first to Nth capacitors C1 to CN is equal to the capacitance of the load capacitor of the load circuit 260 in the case where N equals 10. In this case, after the first to tenth charge sharing operations are sequentially performed, the transmission efficiency of the output voltage VPASSPMP transmitted from the charge pump circuit 200 to the load circuit 250 may be set to 62.5%. In another embodiment, the capacitances of the first to Nth capacitors C1 to CN may be adjusted to further differently set the transmission efficiency of the output voltage VPASSPMP transmitted from the charge pump circuit 200 to the load circuit 250.

Figure 7:
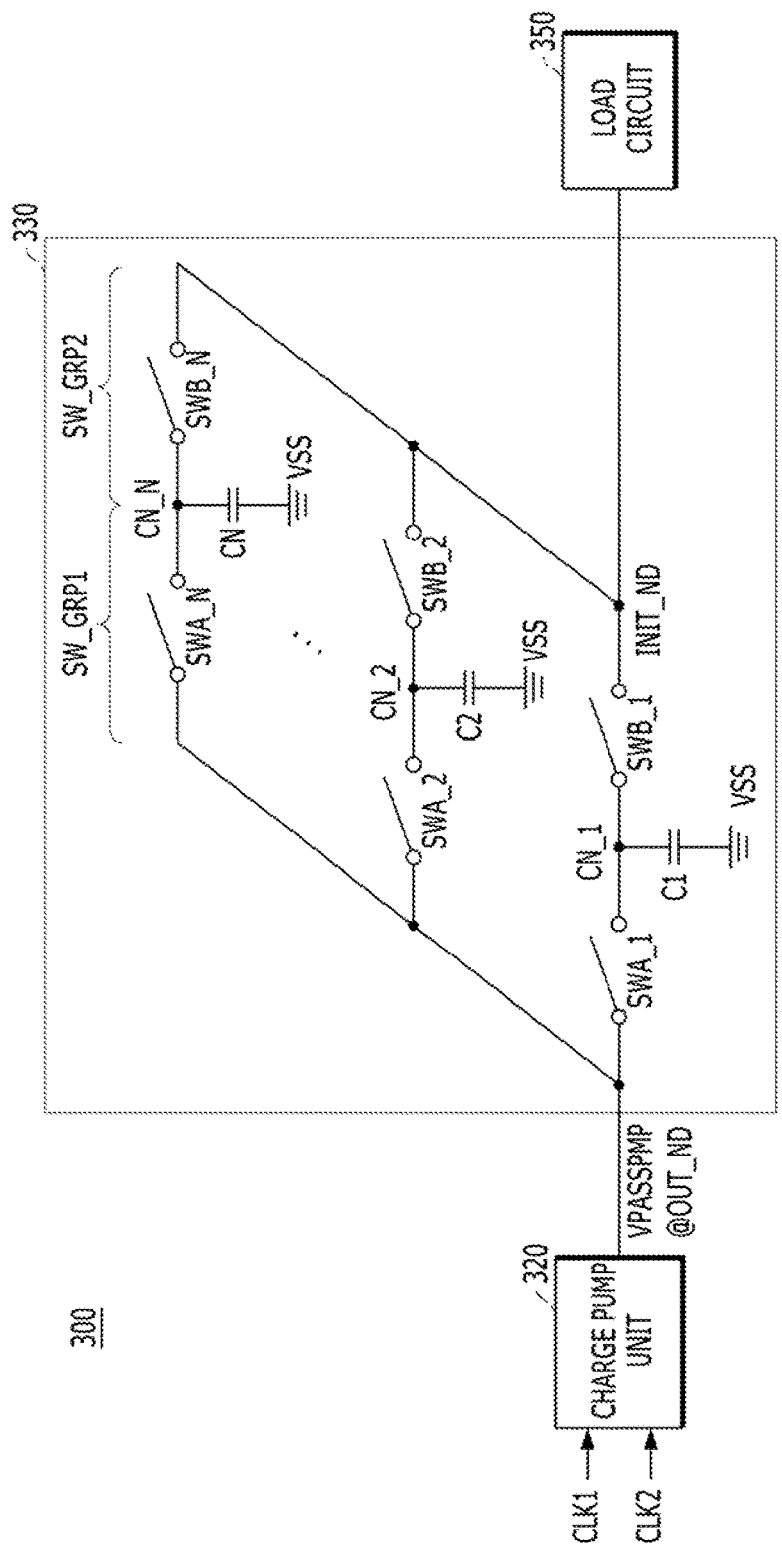
FIG. 7 is a circuit diagram of a charge pump circuit according to yet another embodiment of the present invention.

FIG. 7 is a circuit diagram of a charge pump circuit 300 according to yet another embodiment of the present invention.

Referring to FIG. 7, the charge pump circuit 300 in the embodiment may include a charge pump unit 320 and a multi-stage charge sharing unit 330.

The charge pump unit 320 may perform a charge pump operation until an output voltage VPASSPMP reaches a target voltage. The charge pump unit 320 may include a plurality of switches (not illustrated) which are turned on/off based on first and second clocks CLK1 and CLK2 which are complementary in phase. The charge pump unit 320 may charge first to Nth capacitors C1 to CN of the multi-stage charge sharing unit 330 with charge of a specific node of the switches or discharge the first to Nth capacitors C1 to CN, and thus acquire a boosted output voltage VPASSPMP at an output terminal OUT_ND thereof.

The multi-stage charge sharing unit 330 may include the first to Nth capacitors C1 to CN coupled in parallel between the charge pump unit 320 and a load circuit 350. After the charge pump operation of the charge pump unit 320, the multi-stage charge sharing unit 330 may sequentially perform first to Nth charge sharing operations between the first to Nth capacitors C1 to CN and the load circuit 350. At this time, the first to Nth charge sharing operations may be mutually exclusively performed.

More specifically, the multi-stage charge sharing unit 330 may include first and second switch groups SW_GRP1 and SW_GRP2 and first to Nth capacitors C1 to CN. The first switch group SW_GRP1 may include N (first to Nth) switches SWA_1 to SWA_N each having one terminal coupled to the output terminal OUT_ND of the charge pump unit 320. The second switch group SW_GRP2 may include N (first to Nth) switches SWB_1 to SWB_N each coupled between an input terminal INIT_ND of the load circuit 350 and the other terminal of each of the first to Nth switches SWA_1 to SWA_N of the first switch group SW_GRP1 (that is, common nodes CN_1 to CN_N), respectively. The first to Nth capacitors C1 to CN may be coupled between the ground voltage terminal VSS and the respective common nodes CN_1 to CN_N between the first to Nth switches SWA_1 to SWA_N of the first switch group SW_GRP1 and the first to Nth switches SWB_1 to SWB_N of the second switch group SW_GRP2. At this time, the N switches SWA_1 to SWA_N of the first switch group SW_GRP1 may be all turned on during the charge pump operation, and sequentially turned off during the first to Nth charge sharing operations. In the present embodiment, during the Nth charge sharing operation, the Nth switch SWA_N of the first switch group SW_GRP1 may not be turned off, but maintain the turn-on state. Furthermore, the N switches SWB_1 to SWB_N of the second switch group SW_GRP2 may be all turned off during the charge pump operation, and sequentially turned on during the first to Nth charge sharing operations.

That is, the first to Nth switches SWA_1 to SWA_N of the first switch group SW_GRP1 may be all turned on during the charge pump operation, and turned off from the first to Nth charge sharing operations, respectively. The first to Nth SWB_1 to SWB_N switches of the second switch group SW_GRP2 may be all turned off during the charge pump operation, may be turned on during the first to Nth charge sharing operations, respectively, and then may maintain a turn-off state.

In the present embodiment, the total capacitance of the first to Nth capacitors C1 to CN may be equal to the capacitance of the output capacitor C0 of FIG. 1.

Figures 8, 9:
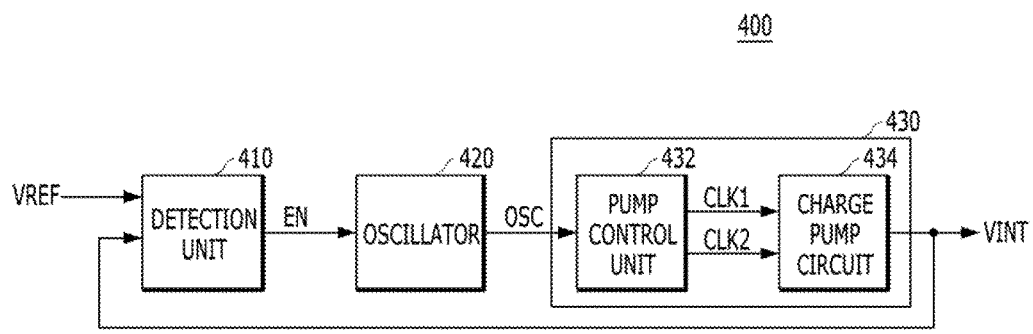
FIG. 8 is a table for describing an operation of the charge pump circuit of FIG. 7.
FIG. 9 is a block diagram of an Internal voltage generation circuit including a charge pump circuit, according to an embodiment of the present invention.

FIG. 8 is a table for describing an operation of the charge pump circuit 300 of FIG. 7.

Referring to FIG. 8, the charge pump operation may be performed at first. During the charge pump operation, the N switches SWA_1 to SWA_N of the first switch group SW_GRP1 may be turned on, and the N switches SWB_1 to SWB_N of the second switch group SW_GRP2 may be all turned off. Thus, the charge pump circuit 300 may charge the first to Nth capacitors C1 to CN with the boosted output voltage VPASSPMP.

Then, the first to Nth charge sharing operations (indicated in the table of FIG. 8 as "first to Nth sharing") may be sequentially performed. During the first to Nth charge sharing operations, the N switches SWA_1 to SWA_N of the first switch group SW_GRP1 may be sequentially turned off, and the N switches SWB_1 to SWB_N of the second switch group SW_GRP2 may be sequentially turned on. Thus, the output voltages VPASSPMP stored in the first to Nth capacitors C1 to CN may be sequentially transmitted to the load circuit 350.

Similarly, after the first to Nth charge sharing operations are sequentially performed, the transmission efficiency of the output voltage VPASSPMP transmitted from the charge pump circuit 300 to the load circuit 350 in accordance with the present embodiment may be improved in comparison to the conventional charge pump circuit 10.

FIG. 9 is a block diagram of an internal voltage generation circuit 400 including a charge pump circuit 440 according to an embodiment of the present invention.

Referring to FIG. 9, the internal voltage generation circuit 400 may also include a detection unit 410, an oscillator 420 and a pump unit 430.

The detection unit 410 may compare a reference voltage VREF and an internal voltage VINT, and output a detection signal EN. When the internal voltage VINT has a lower voltage level than the reference voltage VREF, the detection unit 410 may enable the detection signal EN to a logic high level, and output the detection signal EN. On the other hand, when the internal voltage VINT has a higher voltage level than the reference voltage VREF, the detection unit 410 may disable the detection signal EN to a logic low level, and output the detection signal EN.

The oscillator 420 may output a periodic signal OSC in response to the detection signal EN. The oscillator 420 may output the periodic signal OSC when the enabled detection signal EN is received.

The pump unit 430 may generate the internal voltage VINT in response to the periodic signal OSC. More specifically, the pump unit 430 may include a pump control unit 432 and a charge pump circuit 434.

The pump control unit 432 may generate a plurality of pumping control signals CLK1 and CLK2 for controlling the charge pump circuit 434 in response to the periodic signal OSC. The charge pump circuit 434 may output the internal voltage VINT by charge-pumping an input voltage (for example, power supply voltage VCC) based on the pumping control signals CLK1 and CLK2.

In the present embodiment, the charge pump circuit 434 may include the charge pump circuit 200 of FIG. 5 or the charge pump circuit 300 of FIG. 7. That is, the charge pump circuit 434 may include first to Nth capacitors coupled in parallel between an output terminal of the internal voltage VINT and an internal circuit (not illustrated). The charge pump circuit 434 may perform a charge pump operation in response to the pumping control signals CLK1 and CLK2 until the internal voltage VINT reaches a target voltage, and then sequentially perform first to Nth charge sharing operations between the first to Nth capacitors and the internal circuit. At this time, the charge pump circuit 434 may provide the internal voltage VINT to the internal circuit by mutually exclusively performing the first to Nth charge sharing operations.

The internal voltage generation circuit 400 having the above-described configuration may perform two or more charge sharing operations when providing the internal voltage VINT to internal circuits (not illustrated), thereby improving the transmission efficiency of the internal voltage VINT. Furthermore, the internal voltage generation circuit 400 may reduce a voltage drop at the output terminal of the internal voltage VINT, thereby improving the protection characteristic for a break-down voltage. Furthermore, since the output capacitance of the internal voltage generation circuit 400 decreases after the internal voltage generation circuit 400 is coupled to the internal circuits, the internal voltage VINT may rapidly reach the target voltage of the internal circuits, thereby improving the operating speed of the internal circuits.

Although various embodiments have been described for illustrative purposes, it will be apparent to those skilled in the art that various changes and modifications may be made without departing from the spirit and scope of the invention as defined in the following claims.

For example, the positions and types of the logic gates and transistors used in the above-described embodiments may be set in different manners according to the polarities of input signals.

What is claimed is:

1. A charge pump circuit comprising:
   a charge pump unit performing a charge pump operation until an output voltage reaches a target voltage; and
   a multi-stage charge sharing unit comprising first to Nth capacitors coupled in parallel between the charge pump unit and a load circuit, wherein the multi-stage charge sharing unit sequentially performs first to Nth charge sharing operations between each of the first to Nth capacitors and the load circuit after the charge pump operation, wherein the first to Nth charge sharing operations are mutually and exclusively performed, and N is a natural number equal to or greater than 2.

2. The charge pump circuit of claim 1, wherein the multi-stage charge sharing unit comprises:
   a first switch group comprising first to Nth switches coupled in series between an input terminal of the load circuit and an output terminal of the charge pump unit;
   a second switch group comprising first to (N−1)th switches coupled between the first to (N−1)th capacitors and common nodes between the first to Nth switches of the first switch group, respectively;
   the first to (N−1)th capacitors coupled between a ground voltage terminal and the first to (N−1)th switches of the second switch group, respectively; and
   the Nth capacitor coupled between the output terminal of the charge pump unit and the ground voltage terminal.

3. The charge pump circuit of claim 2, wherein the first to Nth switches of the first switch group are turned off during the charge pump operation and the first to (N−1)th charge sharing operations, respectively, and maintain a turn-on state during other operations.

4. The charge pump circuit of claim 2, wherein the first to (N−1)th switches of the second switch group are turned on during the charge pump operation, and turned off right after the first to (N−1)th charge sharing operations, respectively.

5. The charge pump circuit of claim 1, wherein the total capacitance of the first to Nth capacitors is equal to an output capacitance.

6. An internal voltage generation circuit comprising:
   a detection unit generating a detection signal by comparing a reference voltage and an internal voltage;
   an oscillator generating a periodic signal in response to the detection signal; and
   a charge pump circuit comprising:
      a charge pump unit performing a charge pump operation in response to the periodic signal until the internal voltage reaches a target voltage, and
      a multi-stage charge sharing unit comprising first to Nth capacitors coupled in parallel between the charge pump unit and an internal circuit and sequentially performing first to Nth charge sharing operations between each of the first to Nth capacitors and the internal circuit, after the charge pump operation, wherein the first to Nth charge sharing operations are mutually and exclusively performed to provide the internal voltage to the internal circuit, and the N is a natural number equal to or greater than 2.

7. The internal voltage generation circuit of claim 6, wherein the multi-stage charge sharing unit comprises:
   a first switch group comprising first to Nth switches coupled in series between and an input terminal of the internal circuit and an output terminal of the charge pump unit;
   a second switch group comprising first to (N−1)th switches coupled between the first to (N−1)th capacitors and common nodes between the first to Nth switches of the first switch group, respectively;
   the first to (N−1)th capacitors coupled between a ground voltage terminal and the first to (N−1)th switches of the second switch group, respectively; and
   the Nth capacitor coupled between the output terminal of the charge pump unit and the ground voltage terminal.

8. The internal voltage generation circuit of claim 7, wherein the first to Nth switches of the first switch group are turned off during the charge pump operation and the first to (N−1)th charge sharing operations, respectively, and maintain a turn-on state during other operations.

9. The internal voltage generation circuit of claim 7, wherein the first to (N−1)th switches of the second switch group are turned on during the charge pump operation, and turned off right after the first to (N−1)th charge sharing operations, respectively.

10. A charge pump method of a charge pump circuit which includes first to Nth capacitors coupled in parallel between an output terminal and a load circuit, the charge pump method comprising:
    performing a charge pump operation in response to a periodic signal until an output voltage reaches a target voltage; and
    sequentially performing first to Nth charge sharing operations between each of the first to Nth capacitors and the load circuit, after the charge pump operation, wherein the first to Nth charge sharing operations are mutually and exclusively performed, and the N is a natural number equal to or greater than 2.

* * * * *